United States Patent [19]

Zhang et al.

[11] Patent Number: 5,576,225

[45] Date of Patent: Nov. 19, 1996

[54] METHOD OF FORMING ELECTRIC CIRCUIT USING ANODIC OXIDATION

[75] Inventors: Hongyong Zhang; Hideki Uochi; Hiroki Adachi; Itaru Koyama, all of Kanagawa; Shunpei Yamazaki, Tokyo, all of Japan

[73] Assignee: Semiconductor Energy Laboratory Co., Ltd., Kanagawa-ken, Japan

[21] Appl. No.: 53,227

[22] Filed: Apr. 28, 1993

[30] Foreign Application Priority Data

| May 9, 1992 | [JP] | Japan | 4-143319 |
| Sep. 28, 1992 | [JP] | Japan | 4-282352 |
| Dec. 28, 1992 | [JP] | Japan | 4-360192 |

[51] Int. Cl.⁶ .................................................. H01L 21/84
[52] U.S. Cl. ........................ 437/21; 437/174; 437/194; 437/41
[58] Field of Search ........................... 437/40, 231, 909, 437/228, 174, 21, 194, 41; 257/59

[56] References Cited

U.S. PATENT DOCUMENTS

| 3,775,262 | 11/1973 | Heyerdahl | 204/15 |
| 4,502,204 | 3/1985 | Togashi et al. | |
| 4,826,786 | 5/1989 | Merenda et al. | 437/195 |
| 5,045,485 | 9/1991 | Tanaka et al. | 437/40 |
| 5,071,779 | 12/1991 | Taraka et al. | 437/40 |
| 5,110,766 | 5/1992 | Maeda et al. | 437/228 |
| 5,151,305 | 9/1992 | Matsumoto et al. | 437/252 |
| 5,158,904 | 10/1992 | Ueda | 437/45 |
| 5,166,085 | 11/1992 | Wakai et al. | 437/40 |
| 5,194,136 | 3/1993 | Jeung et al. | 205/122 |
| 5,202,274 | 4/1993 | Bae et al. | 437/40 |
| 5,262,336 | 11/1993 | Pike, Jr. et al. | 437/31 |
| 5,313,076 | 5/1994 | Yamazaki et al. | 257/66 |
| 5,359,206 | 10/1994 | Yamamoto et al. | 257/59 |

FOREIGN PATENT DOCUMENTS

| 1134345 | 5/1989 | Japan | 257/59 |

OTHER PUBLICATIONS

Sugano et al., "Applications of Plasma Processes to VLSI Technology", pp. 216–220, 1985.
Ghandhi, "VLSI Fabrication Principles, Si and GaAs" pp. 585–586, Table 9.5, 1983.

*Primary Examiner*—Mary Wilczewski
*Assistant Examiner*—Richard A. Booth
*Attorney, Agent, or Firm*—Sixbey, Friedman, Leedom & Ferguson, PC; Gerald J. Ferguson, Jr.; Jeffrey L. Costellia

[57] ABSTRACT

An improved method of forming insulated gate field effect transistors is described. In accordance with the method, gate electrodes are formed from metal such as aluminum together with wirings electrically connecting the gate electrodes. The gate electrodes are anodic oxidized by dipping them as an anode in an electrolyte to form an oxide of the metal covering them. Since the connecting wirings are covered with a suitable organic film before the anodizing, no aluminum oxide is formed thereon so that it is easy to remove the connecting wiring by usual etching.

16 Claims, 5 Drawing Sheets

METHOD OF FORMING ELECTRIC CIRCUIT USING ANODIC OXIDATION

BACKGROUND OF THE INVENTION

1. Field of the Invention

The present invention relates in general to an electric circuit and a method for forming the same.

2. Description of the Prior Art

As from '80s, gate electrodes of MOS type semiconductor integrated circuits have been formed mainly from silicon. This is because of the small differential electron energy between the silicon gate and the underlying semiconductor channel region and the great heat resistance of silicon which make it possible to utilize the self-aligning fabrication technique for forming source/drain regions. On the contrary, the self-aligning fabrication technique is not available in the case utilizing aluminum gate electrodes which had been broadly employed prior to the silicon gate. This is because aluminum does not have a sufficient resistance to heat. Aluminum gates have been considered out of date for this reason in spite of the low electric resistance thereof.

Recently, however, it has been reported to utilize the self-aligning fabrication technique for forming source/drain regions also in the case of aluminum gates by employing laser annealing techniques. It has also been proposed that interlayer insulation from the gate electrodes can be sufficiently performed by forming anodic oxide films on the gate electrodes together with wirings formed from the same material at the same time. The gate electrodes and the wirings are generally referred to for both simply as gate electrode wirings hereinbelow because they can not always be exactly distinguished from each other. The aluminum oxide films have a sufficient corrosion resistance and a sufficient pressure resistance and are utilized to form the so-called offset structure between the gate and the source and drain regions as described in Japanese Patent Application No. Hei3-340338, Japanese Patent Application No. Hei4-30220 or Japanese Patent Application No. Hei4-84194 of the same applicants.

Several problems, however, have been pointed out in the technique utilizing anodizing gate electrode wirings. For example, even if the external surfaces of the gate electrode wirings are coated with aluminum oxide films, the adhesivity between them fluctuates depending on the location of the surfaces so that the aluminum oxide films sometimes partially comes off from the underlying gate electrode wirings. In addition to this, the anodic aluminum oxide film are formed with substantially disparity of the thickness depending on the location on the gate electrodes. Furthermore, since the aluminum oxide films have an extremely strong resistance against corrosion, it is difficult to remove them by usual wet etching or dry etching so that other materials such as silicon oxide existing near the aluminum oxide films tend to be etched during the removal of the aluminum oxide films. Furthermore, since the gate electrode wirings are integrally connected to each other during the anodizing in order to treat the gate electrodes as an anode, unnecessary portions connecting the individual gate electrodes must be removed after the anodizing to separate them. The unnecessary portions, however, are also coated with aluminum oxide and therefore it is very difficult to remove them. Furthermore, it is also difficult to open necessary contact holes through the corrosion-proof aluminum oxide films to access the underlying gate electrode wirings so that neighboring circuit elements are also corroded.

On the other hand, it is proposed to partially remove the gate electrode wiring coated with aluminum oxide and to open contact holes by exposing necessary portions to high energy laser illumination as described in Japanese Patent Application No. Hei3-348130. The underlying gate electrode wirings are damaged by the high energy laser light so that it seems impossible to form contact holes by this method.

BRIEF SUMMARY OF THE INVENTION

As pointed out in the above, there are following shortcomings in the technique utilizing gate electrodes coated with anodic oxide films.

1) Disparity of adhesivity between the gate electrodes and the covering anodic oxide film resulting in peeling off.

2) Difficulty in removing unnecessary portions of the gate electrode wirings coated with anodic oxide film and forming contact holes through the anodic oxide films.

3) Disparity of the thickness of the anodic films.

It has been discovered through research conducted by the inventors that the above shortcomings 1) and 3) result mainly from variation of the potential level over the external surfaces of the gate electrode wirings and therefore from the variation of the electric current passing therethrough. The oxidation speed of the aluminum surface during anodizing is dictated by the potential level at the respective location in question. Namely, the difference in the anodizing speed is considered to reflect the difference in potential level. As a result, the anodic oxide films grow on narrow patterns at speeds faster than in wide patterns and tend to peel off due to the difference in adhesivity.

It is therefore an object of the present invention to provide a method of manufacturing improved electronic devices having aluminum gate electrodes.

It is another object of the present invention to provide a method of manufacturing improved electronic devices by the use of anodic oxidation.

It is a further object of the present invention to provide a method of manufacturing improved electronic devices in which patterning of anodized aluminum wirings can be easily carried out.

It is a still further object of the present invention to provide a method of manufacturing improved electronic devices suitable for forming very fine structures thereof.

It is a still further object of the present invention to provide an improved electronic devices having anodic oxidized aluminum gate electrodes.

Additional objects, advantages and novel features of the present invention will be set forth in the description which follows, and in part will become apparent, to those skilled in the art upon examination of the following or may be learned by practice of the present invention. The object and advantages of the invention may be realized and attained by means of the instrumentalities and combinations particularly pointed out in the appended claims.

To achieve the foregoing and other object, and in accordance with the present invention, as embodied and broadly described herein, a method for manufacturing semiconductor devices comprising the steps of forming an aluminum pattern which is electrically undevided on a substrate, partially covering the aluminum pattern with a resist film, anodizing an external surface of the aluminum pattern which is not covered with the resist film, and removing the resist film. Particularly, the aluminum pattern is partially covered with aluminum oxide by the anodizing and, after the removing step, provided with an exposed surface through which the underlying aluminum pattern can be removed or electrically accessed.

In the case of forming insulated gate field effect transistors, a film comprising a material selected from the group consisting of aluminum, tantalum, aluminum having added thereto silicon, copper, tantalum, scandium and palladium, an alloy thereof and a multi-layer thereof is formed on a substrate, and said film is patterned to form gate electrodes, common connecting lines and higher level common connecting lines. The gate electrodes are anodic oxidized by dipping them as an anode in an electrolyte to form aluminum oxide covering them. Since the connecting wirings are covered with a suitable organic film before the anodizing, no aluminum oxide is formed thereon so that it is easy to remove the connecting wiring by usual etching.

In accordance with an aspect of the present invention, a plurality of gate electrodes are divided into a plurality of group. The gate electrodes belonging to each group are connected to a corresponding one of a plurality of common connecting lines having a width larger than that of the gate electrodes. Width of the common connecting lines is increased to be larger than width of the gate electrodes in order to reduce resistance of the first wiring. The common connecting lines are connected, in turn, to a higher level common connecting line. Namely, the whole aluminum pattern is designed in a hierarchy fashion. An electric circuit in accordance with the present invention comprises such a gate electrode provided on a substrate, such a common connecting line as a first wiring provided on the substrate, and such a higher level common connecting line as a second wiring provided on the substrate. The second wiring has a width larger than that of the first wiring. Width of the second wiring is increased to be larger than width of the first wiring in order to reduce resistance of the second wiring. The gate electrode, the first wiring and the second wiring comprise the same material selected from the group consisting of aluminum, tantalum, aluminum having added thereto silicon, copper, tantalum, scandium and palladium, an alloy thereof and a multi-layer thereof. A channel is formed on the substrate and adjacent to the gate electrode with a gate insulating film therebetween. A typical example can be seen from FIG. 1(A). In the figure, a number of gate electrodes 6 are connected to a branch line 5 having a wider width while a number of branch lines 5 are connected to a trunk line having a furthermore wider width. By this fashion, the thicknesses and the degrees of adhesivity of anodic oxide films coated on the gate electrodes at the tips of the hierarchy system are equal to each other.

The aluminum pattern including the gate electrodes can be etched by a dry etching technique such as laser etching to improve the yield since the aluminum portions to be etched are not covered by the corrosion-proof aluminum oxide film. Because of this, very fine geometrical structure can be fabricated. Prior to the present invention, aluminum oxide must be removed by wet etching which is capable of removing aluminum oxide but not suitable for fabricating very fine structures and so that the integration density can not be improved so high.

Ratio (width of the first wiring)/(width of the gate wiring) is preferably 2 to 10. And ratio (width of the second wiring)/(width of the first wiring) is 2 to 10.

BRIEF DESCRIPTION OF THE DRAWINGS

The accompanying drawings, which are incorporated in and form a part of the invention and, together with the description, serve to explain the principles of the invention.

DETAILED DESCRIPTION OF THE PREFERRED EMBODIMENTS

Referring now to FIGS. 1(A) to 1(D) and FIGS. 2(A) to 2(D), a method of manufacturing complementary thin film insulated gate field effect transistors in accordance with a first embodiment of the present invention will be explained. FIGS. 1(A) to 1(D) and FIGS. 2(A) to 2(D) are plotted conceptually in a correspondence but not in an exactly geometrical correspondence for convenience of illustration and explanation.

Figure 1A:
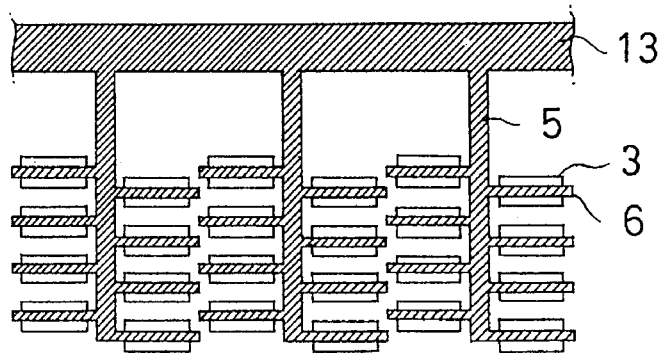
FIGS. 1(A) to 1(D) are plan views showing a method of manufacturing complementary thin film insulated gate field effect transistors in accordance with a first embodiment of the present invention.
Figure 2A:
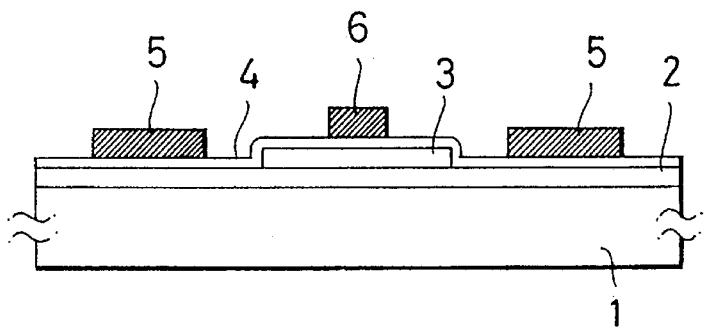
FIGS. 2(A) to 2(D) are cross sectional views showing a method of manufacturing complementary thin film insulated gate field effect transistors in accordance with the first embodiment of the present invention in a conceptual correspondence with FIGS. 1(A) to 1(D).

A glass plate is used as a substrate 1. The glass plate is, for example, the Corning 7059 glass plate manufactured by Corning Corp. A silicon oxide film 2 is formed on the substrate to a thickness of 100 nm by sputtering. An amorphous semiconductor film is deposited on the silicon oxide film 2 to a thickness of 150 nm by plasma CVD. The semiconductor film is then recrystallized by thermal annealing at 600° C. for 60 hours and patterned into a plurality of semiconductor islands 3 by photolithography and reactive ion etching. A silicon oxide film 4 is deposited to a thickness of 115 nm by sputtering in oxygen with a target of silicon oxide to form gate insulating films. An aluminum film is formed on the silicon oxide film 4 to a thickness of 500 nm by electron beam evaporation and patterned by etching, e.g. wet etching with a mixed acid etchant prepared by adding a 5% nitric acid to phosphoric acid in order to form gate electrodes 6, feader lines 5 and trunk lines 13. The gate electrodes 6, the feader lines 5 and the trunk lines 13 are formed to electrically connected to each other as illustrated in FIG. 1(A). The etching ratio is, for example, about 225 nm/min. The width of the feader lines 5 is 4 micrometers. The width of the trunk lines 13 is 10 micrometers. The channels formed just under the gate electrodes 6 are 2 micrometers long and 12 micrometers wide. By the above procedure, the indispensable outlines of the transistors are formed on the substrate as illustrated in FIGS. 1(A) and 2(A). An organic coating is selectively formed on the gate electrode or the wiring connected therewith (the leader lines and trunk lines) provided on the substrate.

The gate electrodes 6 or the wiring connected therewith are then anodic oxidized by supplying current thereto in an electrolyte with the feader lines 5 and the trunk lines 13 being partially coated with organic coating films in order that the aluminum films to be removed or providing contacts are not covered with corrosion-proof oxide films. A portion or at least a portion of the organic coating is etched to expose the gate electrode or the wiring connected therewith in said portion. The organic coating films are preferably formed from an organic material having a heat resistance at a temperature of 270° C. or higher. For this purpose, polyimide based organic materials are appropriate. A typical example of such polyimide based material is Photoneece (UR3800) which is a photosensitive organic resin manufactured by Tore Industries Company. This resin can be easily patterned. The organic coating of this kind can be easily removed (etched) by a suitable solvent such as hydrazine, or by plasma generated in an oxygen or other oxidizing gas atmospheres, e.g. nitrogen dioxide or ozone. On the other hand, the organic coating of this kind can resist against the anodizing environment.

Figure 5:
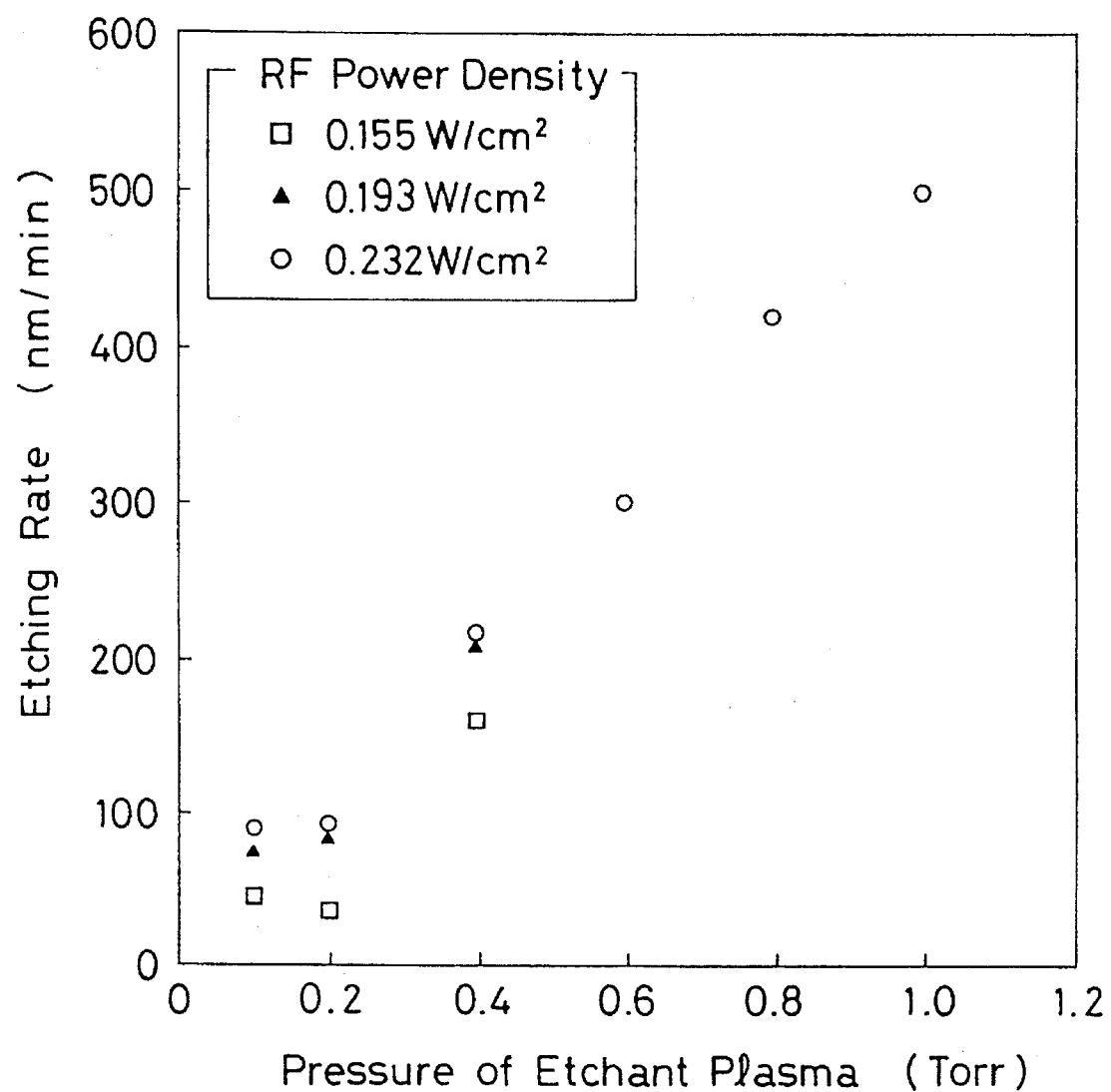
FIG. 5 is a graphical view showing the relationship between the pressure of an oxygen plasma atmosphere as an etchant gas and the etching rate of an organic coating made of Photoneece with a thickness of 2.3 micrometers in the oxygen plasma.

FIG. 5 illustrates the relationship between the pressure of an oxygen plasma atmosphere and the etching rate of an organic coating made of Photoneece with a thickness of 2.3 micrometers. The partial pressure of oxygen is 100%. The plasma is generated by applying RF electric energy between a pair of flat plates arranged in parallel at room temperature to carry out etching (ashing) therein. Oxygen is continuously supplied to the etching space at 2.3 SCCM. As understood from the figure, the etching rate is in proportion to the pressure of the oxygen plasma. Although not shown in the figure, it was found in accordance with experiments that the etching rate was increased by elevating the temperature during ashing with a linear proportional relationship therebetween in a range of from room temperature to 300° C. Accordingly, it has been confirmed that the etching performance can be improved by increasing the partial pressure of the oxidizing gas.

Figure 1B:
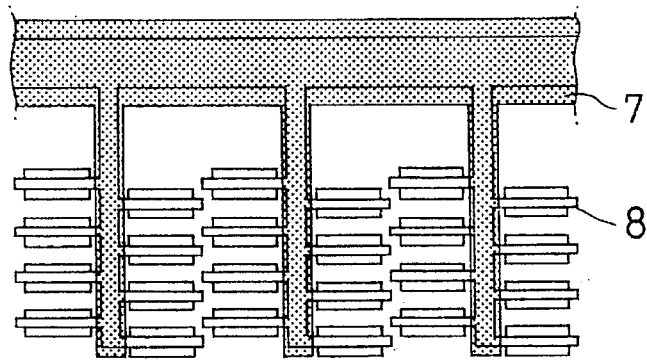

Namely, Photoneece (UR3800) manufactured by Tore Industries Company is coated by spin coating on the substrate 1 over the gate electrodes 6, the feader lines 5 and the trunk lines 13. The rotation speed is 2500 rpm. The organic film is dried by baking at 80° C. for an hours in nitrogen. After the baking, the coating film is then partially removed by patterning in order to leave only the film 7 covering the feader lines 5 and the trunk lines 13 as illustrated in FIG. 1(B). The coating film 7 is baked again at 300° C. for 0.5 to 2 hours in order to make it a polyimide film. The external surfaces of the gate electrodes 6, i.e. the upper and side surfaces thereof are then anodic oxidized to form aluminum oxide films covering them. The anodizing is carried out by dipping the substrate with the gate electrodes as an anode in a solution together with a platinum plate as a cathod and passing a current through the gate electrodes 6, the feader lines 5 and the trunk lines 13. The solution is prepared by neutralizing an ethylene glycol solution of 3% tartaric acid with a 5% ammonia water added in order that the, pH falls in 7.0±0.2. The temperature of the solution is maintained during the anodizing at 25°±2° C.

Figure 2B:
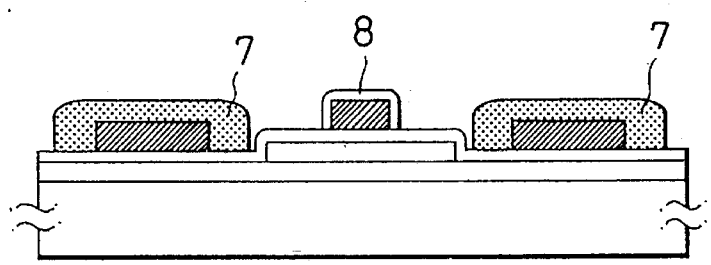

The current is passed through the gate electrodes 6, the feader lines 5 and the trunk lines 13 during the anodizing in the following manner. First, the voltage between the anode and the cathod is adjusted in order to pass a current at 0.1 to 0.5 mA/cm$^2$, for example, 0.5 mA/cm$^2$. The voltage is gradually increased in order to maintain the current density. When the voltage reaches to 250 V, the anodizing is continued with the voltage being kept at 250 V whereas the current density is gradually decreased. When the current density is decreased to 0.005 mA/cm$^2$, the substrate is removed from the solution and placed in a plasma chamber in which ashing of the substrate is carried out to remove the Photoneece film 7. The pressure in the plasma chamber is 0.2 to 2.0 Torr. The RF power is 0.1 to 0.3 W/cm$^3$. The plasma formed in the chamber during ashing is an oxygen plasma. The etching ratio by the ashing is improved by heating the substrate at 90° to 300° C. As a result, the aluminum oxide films 8 are formed to a thickness of 320 nm as illustrated in FIGS. 1(B) and 2(B).

Figure 1C:
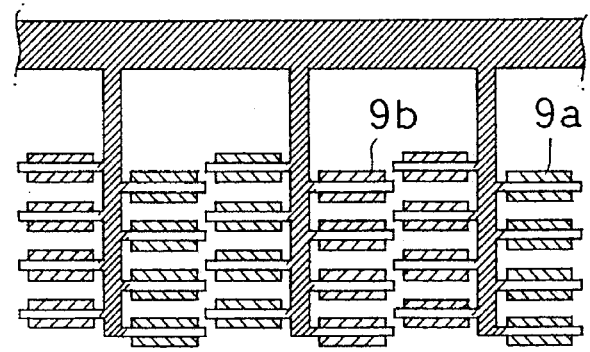
Figure 1D:
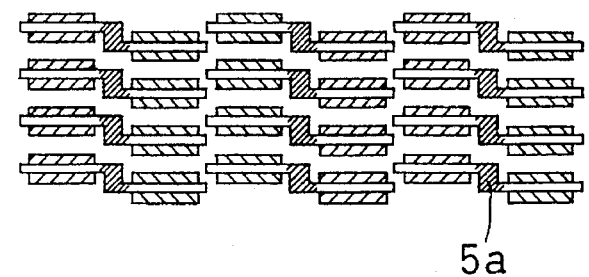
Figure 2C:
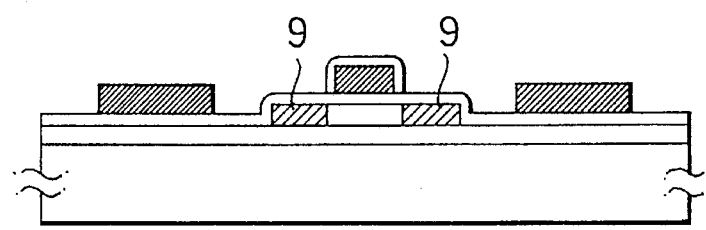
Figure 2D:
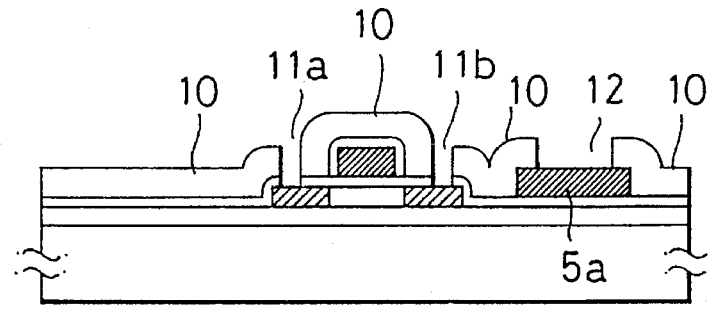

Next, source and drain regions are formed within the semiconductor islands 3 to form n-channel and p-channel regions therebetween by ion implantation in accordance with the known CMOS manufacturing technique. Numerals 9a and 9b in FIG. 1(C) designate p-channel and n-channel transistors respectively. Namely, phosphorous ions are implanted into the semiconductor island for the p-channel transistor 9a with an acceleration voltage of 70 to 110 KeV while the gate electrode 6 and the aluminum oxide film 8 cover the middle portions of the semiconductor islands to be the channel regions. The concentration of phosphorous ions is finally 1 to $5\times10^{13}$cm$^{-2}$. Boron fluoride ions (BF$_3^+$) are implanted in the same procedure into the semiconductor island for the n-channel transistors 9b. In the light of the aluminum oxide films 8, the source and drain regions 9 are formed a certain distance apart from the edge of the gate electrodes in the so-called offset structure as illustrated in FIG. 2(C). The offset distance is considered to be about 300 nm corresponding to the thickness of the aluminum oxide film 8.

Since the crystallinity of the source and drain regions 9 is substantially damaged by the ion implantation so as to be substantially amorphous, laser annealing is performed in order to recrystallize the source and drain regions. The laser annealing is carried out by irradiating the semiconductor with 50 shots of a laser pulse emitted from a KrF excimer laser. The energy density of the laser pulse is, for example, 350 mJ/cm$^2$. The laser can be replaced in this case by a halogen lamp to obtain the same performance. After the annealing, the feader lines 5 and the trunk lines 13 are selectively removed in order to leave only part 5a of the leader lines 5 as illustrated in FIG. 1(C). A plurality of CMOS gate array are then formed. The gate electrodes can be accessed through the part 5a without difficulties.

The structure is then coated with a silicon oxide interlayer film 10 deposited by sputtering. Contact holes 11a and 11b are opened through the silicon oxide films 4 and 10 by a known photolithography technique to expose the source and drain regions 9. Appropriate contact holes 12 may be also opened through the silicon oxide films 4 and 10 to expose the wiring 5a. These contact holes may be formed at the same time or separately in accordance with appropriate procedures necessary for the method. Finally, necessary wirings are formed from a metallic film by depositing and patterning an aluminum or chromium film.

Referring now to FIGS. 3(A) to 3(D), a method of manufacturing complementary thin film insulated gate field effect transistors in accordance with a second embodiment of the present invention will be explained. The plan views of FIGS. 3(A) to 3(D) are in a conceptual correspondence with FIGS. 1(A) to 1(D) in the same manner as FIGS. 2(A) to 2(D).

A glass plate is used as a substrate 21. The glass plate is, for example, the Corning 7059 glass plate manufactured by Corning Corp. A silicon oxide film 22 is formed on the substrate to a thickness of 100 nm by sputtering. An amorphous semiconductor film is deposited on the silicon oxide film 22 to a thickness of 50 nm by low pressure CVD. The semiconductor film is then recrystallized by laser annealing. The laser annealing is carried out by irradiating the semiconductor with pulsed light emitted from a KrF excimer laser. The energy density of the laser pulse is, for example, 150 to 350 mJ/cm$_2$, preferably 250 to 300 mJ/cm$_2$. The semiconductor film is then patterned into a plurality of semiconductor film islands 23 provided on the substrate by photolithography and reactive ion etching. A silicon oxide film 24 is deposited on the substrate 21 over the semiconductor film islands 23 to a thickness of 115 nm by sputtering in oxygen with a target of silicon oxide to form gate insulating films. An aluminum film is formed on the silicon oxide film 24 to a thickness of 500 nm by electron beam evaporation and patterned by etching with a mixed acid prepared by adding a 5% nitric acid to phosphoric acid in order to form gate electrodes 26, feader lines and trunk lines, i.e. the gate electrode wirings in the same manner as in the first embodiment. The etching ratio is, for example, about 225 nm/min. The channels formed just under the gate electrodes 26 are 2 micrometers long and 12 micrometers wide. By the above procedure, the indispensible outlines of the transistors are formed on the substrate as illustrated.

Figure 3A:
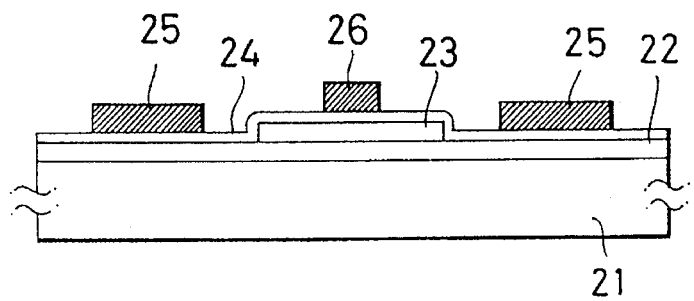
FIGS. 3(A) to 3(D) are cross sectional views showing a method of manufacturing complementary thin film insulated gate field effect transistor in accordance with a second embodiment of the present invention.
Figure 3B:
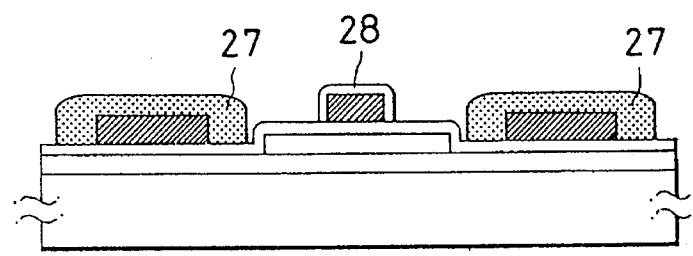

A photosensitive organic resin is coated by spin coating on the substrate 21 over the gate electrode wirings. The photosensitive organic resin is, for example, Photoneece (UR3800) manufactured by Tore Industries Company. The rotation speed is 2500 rpm. The coating film is partially removed by patterning in order to leave only the film 27 covering the wirings 25 as illustrated in FIG. 3(B). The external exposed surfaces of the gate electrodes 26, i.e. the upper and side surfaces thereof are then anodic oxidized to form aluminum oxide films covering them. The anodizing is carried out by dipping the substrate with the gate electrodes as an anode in a solution together with a platinum plate as a cathode and passing a current through the gate electrodes 26. The solution is prepared by neutralizing an ethylene glycol solution of 3% tartaric acid with a 5% ammonia water added in order that the pH falls in 7.0±0.2. The temperature of the solution is maintained during the anodizing at 25°±2° C.

The current is passed through the gate electrodes 26 during the anodizing in the following manner. First the voltage between the anode and the cathode is adjusted in order to pass a current at 0.1 to 0.5 mA/cm$^2$, for example 0.5 mA/cm$^2$. The voltage is gradually increased in order to maintain the current density. When the voltage reaches to 250 V, the anodizing is continued with the voltage being kept at 250 V whereas the current density is gradually decreased. When the current density is decreased to 0.005 mA/cm$^2$, the anodizing is finished. As a result, the aluminum oxide films 28 are formed to a thickness of 320 nm as illustrated in FIGS. 1(B) and 2(B).

Figure 3C:
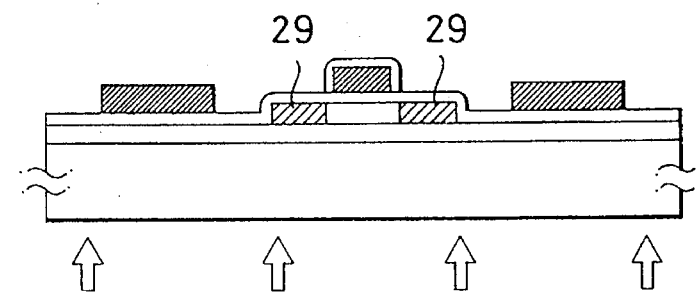
Figure 3D:
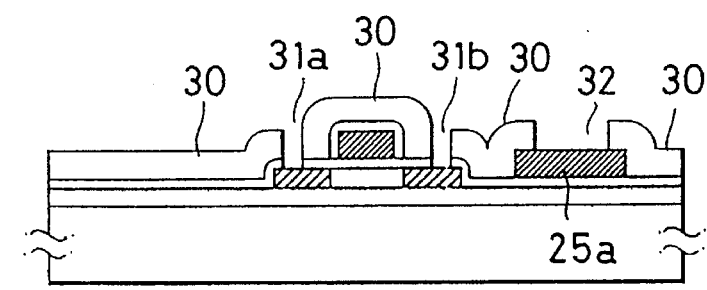

Next, source and drain regions are formed on the substrate within the semiconductor film islands 23 to form n-channel and p-channel regions therebetween by ion implantation in accordance with the known CMOS manufacturing technique. P-channel and n-channel transistors are formed in the same manner as in the first embodiment. Namely, phosphorous ions as impurities are introduced into the semiconductor film island for the p-channel transistor with an acceleration voltage of 70 to 110 KeV while the gate electrode 26 and the aluminum oxide film 28 cover the middle portions of the semiconductor film islands to be the channel regions. The concentration of phosphorous ions is finally 1 to $5 \times 10^{13}$ cm$^{-2}$. Boron fluoride ions ($BF_3^+$) are introduced in 30 the same procedure into the semiconductor film island for the n-channel transistors. In the light of the aluminum oxide films 28, the source and drain regions 29 sandwiching the channel are formed a certain distance apart from the edge of the gate electrodes in the so-called offset structure as illustrated in FIG. 3(C). An offset region is provided between the channel and each of the source and drain. The offset distance is considered to be about 300 nm corresponding to the thickness of the aluminum oxide film 28. The formation of source and drain regions may be carried out by the plasma doping technique (i.e., the ion doping technique), which can not separate different ions according to the mass differences, or another suitable doping technique.

After removing the Photoneece film 27, laser annealing is performed in order to recrystallize the source and drain regions in the same manner as in the first embodiment. In this case, however, the laser annealing is carried out by irradiating the semiconductor with 10 shots of a laser pulse through the substrate 21. Namely, the pulsed laser light is directed to the rear surface of the substrate 21. The laser is a XeCl excimer laser (308 nm wavelength) or a KrF excimer laser (350 nm wavelength). The selection of the laser is done taking the transparency of the substrate (Corning 7059 in this case) into consideration. If the substrate is made of quartz, a KrF laser (248 nm wavelength) can be utilized. The energy density of the laser pulse is, for example, 350 mJ/cm$^2$. The laser can be replaced by a halogen lamp to obtain the same performance. After the annealing, the wirings 25 which are not coated with aluminum oxide are selectively removed in order to leave only part 25a as illustrated in FIG. 3(C). As a result, a plurality of CMOS gate array are formed.

The structure is then coated with a silicon oxide interlayer film 30 deposited by sputtering. Contact holes 31a and 31b are opened through the silicon oxide films 24 and 30 by a known photolithography technique to expose the source and drain regions 29. Appropriate contact holes 32 may be also opened through the silicon oxide films 24 and 30 to expose the wiring 25a. These contact holes may be formed at the same time or separately in accordance with appropriate procedures necessary for the method. Finally, necessary wirings are formed from a metallic film by depositing and patterning an aluminum or chromium film.

In the case of the second embodiment, the semiconductor film islands are recrystallized by laser annealing in the same manner as in the first embodiment. The second laser annealing, however, is carried out by irradiating the substrate and the semiconductor film island with a laser light or a light emitted from a halogen lamp from the rear surface (from the back of the substrate) after the introduction of the impurity. This makes it possible to form the source and drain regions continuously and smoothly connected to the channel region located therebetween. If the first laser annealing is omitted, the upper portions of the semiconductor film islands may not be sufficiently recrystallized. For this reason, it is preferred to perform the laser annealing (or lamp annealing) from the both sides of the substrate. Furthermore, since the second laser annealing is performed from the rear surface of the substrate, it is effectively avoided that the gate electrode wirings are coming off due to the differential thermal expansion coefficient between the portions covered by aluminum oxide films and the portions which are not covered by aluminum oxide films.

Figure 4A:
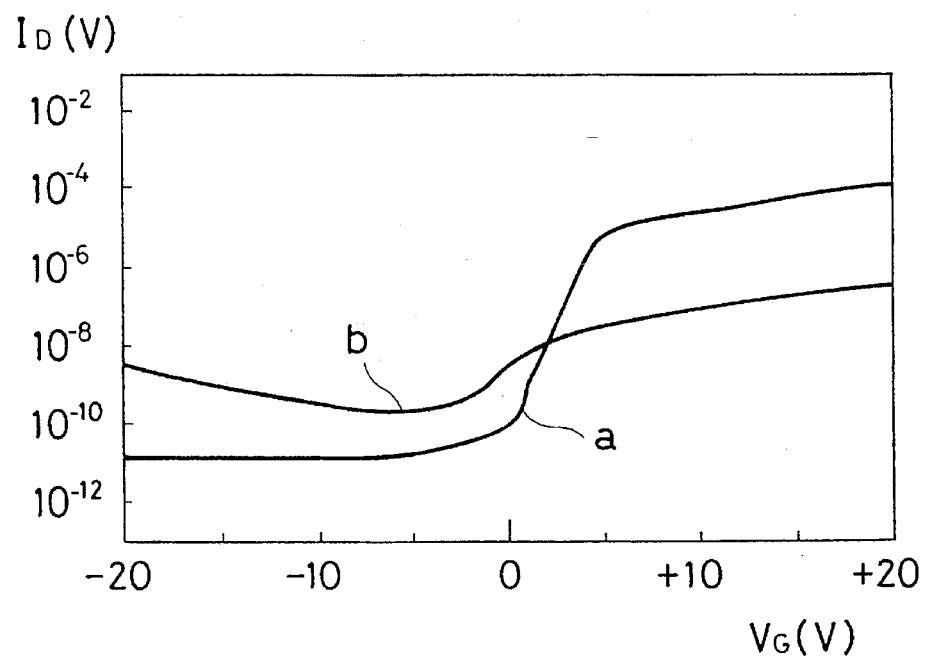
FIG. 4(A) is a graphical views showing the $V_G$–$I_D$ characteristics of a thin film insulated gate field effect transistor manufactured in accordance with the first embodiment of the present invention.
Figure 4B:
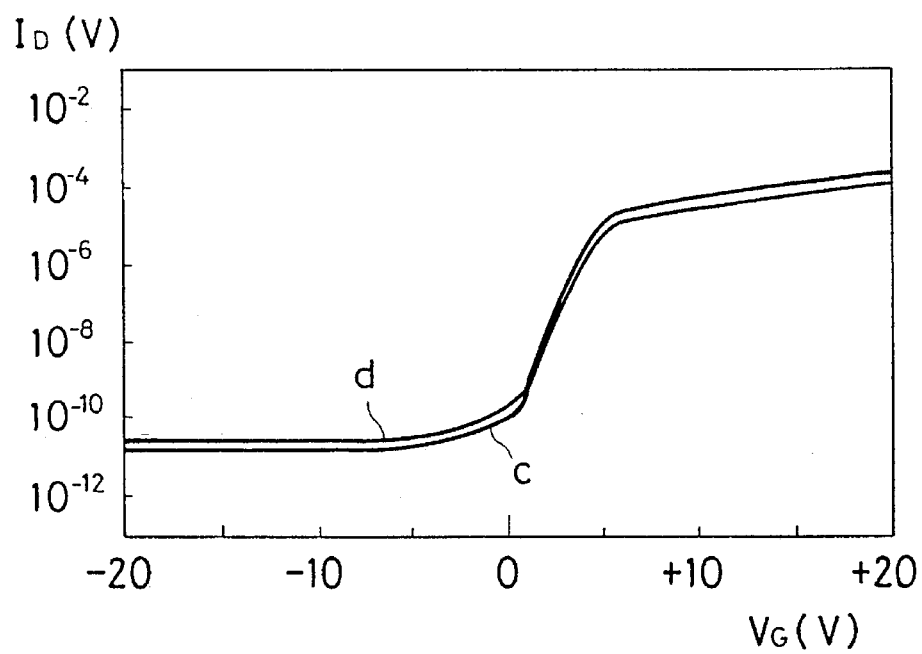
FIG. 4(B) is a graphical views showing the $V_G$–$I_D$ characteristics of a thin film insulated gate field effect transistor manufactured in accordance with the second embodiment of the present invention.

The actual advantage of irradiation from the rear surface of the substrate will be understood from FIGS. 4(A) and 4(B). In the case of irradiation from the upper surface, the $I_D$–$V_G$ characteristics were initially good as depicted by curve (a) in FIG. 4(A) but significantly deteriorated as depicted by curve (b) when a pulse of 25 to 30 V was repeatedly applied to the gate electrode. This is considered because hydrogen atoms terminating dangling bonds broke away from the interfaces between the channel region and the source and drain regions since the interface is discontinuous and provides poor connection. On the other hand, when the semiconductor film islands are irradiated with laser light from the rear surface of the substrate, the initial characteristics as depicted by curve (c) in FIG. 4(B) were maintained without appreciable deterioration even after operation for 100 hours as depicted by curve (d) in FIG. 4(B).

The foregoing description of preferred embodiments has been presented for purposes of illustration and description. It is not intended to be exhaustive or to limit the invention to the precise form described, and obviously many modifications and variations are possible in light of the above teaching. The embodiment was chosen in order to explain most clearly the principles of the invention and its practical application thereby to enable others in the art to utilize most effectively the invention in various embodiments and with various modifications as are suited to the particular use contemplated.

What is claimed is:

1. A method for forming an electric circuit comprising:

forming a gate electrode and a wiring electrically connected to said gate electrode on an insulating surface of a substrate;

forming an organic coating on said wiring;

applying a voltage to said wiring in an electrolyte in order to anodic oxidize a surface of said gate electrode which is not provided with said organic coating;

removing at least a portion of said organic coating to expose a surface of said wiring; and removing at least a portion of said wiring which is not formed with an anodic coating thereon.

2. The method of claim 1 wherein said organic coating comprises a polyimide.

3. The method of claim 1 wherein the gate electrode and the wiring connected therewith comprise a material selected from the group consisting of aluminum, tantalum and aluminum having added thereto silicon, copper, tantalum, scandium or palladium.

4. The method of claim 1 wherein said organic coating has a heat resistance at a temperature of 270° C. or higher.

5. The method of claim 1 further comprising forming on said substrate a structure comprising a channel adjacent to the gate electrode with a gate insulating film therebetween, and source and drain sandwiching said channel.

6. The method of claim 5 wherein said source and drain are formed by introducing an impurity into a semiconductor film provided on said substrate.

7. The method of claim 6 further comprising irradiating said semiconductor film with a laser light or a light emitted from a halogen lamp from the back of said substrate after the introduction of said impurity.

8. A method for forming an electric circuit comprising:

preparing a pattern of a conductive film on a substrate;

covering a portion of said pattern with a mask;

anodic oxidizing another portion of the pattern on which said mask is not provided by supplying an electric current to said conductive film in an electrolyte so that said conductive film is selectively covered with an anodic oxide film; and removing said mask to expose a surface of said conductive film, further comprising the step of etching at least a part of said portion of the pattern.

9. A method for forming an electric circuit comprising:

forming a conductive lead including a gate electrode therein, and a temporary wiring electrically connected to said lead on an insulating surface of a substrate;

forming an organic coating on said temporary wiring and a portion of said conductive lead;

selectively forming an anodic oxide coating on said conductive lead which is not covered by said organic coating by applying a voltage to said temporary wiring;

removing at least a portion of said organic coating to expose at least a surface of said temporary wiring; and removing said temporary wiring after removing said organic coating.

10. The method of claim 8 wherein said mask comprises an organic material.

11. The method of claim 1, 9 or 10 wherein said organic material is removed by plasma ashing using an oxidizing gas.

12. A method for forming an electric circuit comprising the steps of:

preparing a pattern of a conductive film on an insulating surface of a substrate, said pattern including a first wiring and a plurality of gate electrodes electrically connected to said first wiring, respectively;

anodic oxidizing at least said plurality of said gate electrodes by applying a voltage to said gate electrodes from said wiring, said wiring having a width larger than a width of said gate electrode; and removing at least a portion of said first wiring after said anodic oxidizing, wherein said pattern further includes a second wiring connected to said first wiring so that said voltage is supplied to said gate electrodes from said second wiring via said first wiring, said second wiring having a width larger than the width of said first wiring.

13. The method of claim 12 further comprising the step of removing at least a portion of said second wiring after said anodic oxidizing.

14. The method of claim 1 wherein the gate electrode and the wiring connected therewith comprise an alloy of aluminum, tantalum, or aluminum having added thereto silicon, copper, tantalum, scandium or palladium.

15. The method of claim 1 wherein the gate electrode and the wiring connected therewith comprise a multi-layer of aluminum, tantalum, or aluminum having added thereto silicon, copper, tantalum, scandium or palladium.

16. The method of claim 8, wherein said pattern corresponds to a gate electrode and a wiring electrically connected thereto such that said mask is not formed on said gate electrode.

* * * * *